United States Patent
Sonobe

(12) 
(10) Patent No.: US 6,295,617 B1
(45) Date of Patent: *Sep. 25, 2001

(54) TESTING METHOD OF SEMICONDUCTOR MEMORY DEVICE AND SEMICONDUCTOR MEMORY DEVICE APPLICABLE TO THE METHOD

(75) Inventor: Satoru Sonobe, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/107,292

(22) Filed: Jun. 30, 1998

(30) Foreign Application Priority Data

Jun. 30, 1997 (JP) ...................................... 9-173719

(51) Int. Cl.$^7$ ...................................................... G11G 29/00
(52) U.S. Cl. ............................................................... 714/718
(58) Field of Search ................................... 714/718, 764, 714/800, 758, 805, 782, 8, 711, 763, 773, 710, 52; 711/118; 365/200, 201, 208

(56) References Cited

U.S. PATENT DOCUMENTS 4,903,268 * 2/1990 Hidaka et al. ........................ 714/718
5,337,318 * 8/1994 Tuskakoshi et al. ................. 714/708
5,588,112 * 12/1996 Dearth et al. ............................. 714/9

FOREIGN PATENT DOCUMENTS 61-187199 8/1986 (JP) ............................... G11C/29/00
5-54697 3/1993 (JP) ............................... G11G/29/00

OTHER PUBLICATIONS

Ono, T et al. (On–board satellite switch controller for multi–beam communication satellite; IEEE, 1990).*

* cited by examiner

Primary Examiner—Albert Decady
Assistant Examiner—Guy J. Lamarre
(74) Attorney, Agent, or Firm—Sughrue, Mion, Zinn, Macpeak & Seas, PLLC

(57) ABSTRACT

In the test, the semiconductor memory device capable of error correction is tested to judge whether or not errors which exceed the correction ability of the error correction occur in the memory section of the device. As a result of the test, the semiconductor memory device in question is judged normal when errors occurring therein do not exceed the correction ability. The device subjected to the test is determined not to have any serious problem, even if it includes any errors, since such errors are always corrected by error correction of the device. Thus, according to this invention, the yield of the semiconductor memory device drastically can increase.

17 Claims, 10 Drawing Sheets

$$H'' = \begin{Bmatrix} 0 & 0 & 0 & 0 & 1 \\ 0 & 0 & 0 & 1 & 0 \\ 0 & 0 & 1 & 0 & 0 \\ 0 & 1 & 0 & 0 & 0 \\ 1 & 0 & 0 & 0 & 0 \\ 0 & 0 & 0 & 1 & 1 \\ 0 & 0 & 1 & 0 & 1 \\ 0 & 1 & 0 & 0 & 1 \\ 1 & 0 & 0 & 0 & 1 \\ 1 & 1 & 0 & 1 & 0 \\ 1 & 0 & 1 & 1 & 0 \\ 0 & 1 & 1 & 1 & 0 \\ 1 & 1 & 1 & 0 & 0 \\ 1 & 0 & 0 & 1 & 0 \\ 0 & 0 & 1 & 1 & 0 \\ 0 & 1 & 1 & 0 & 0 \\ 1 & 1 & 0 & 0 & 0 \end{Bmatrix}$$

FIG. 6

TESTING METHOD OF SEMICONDUCTOR MEMORY DEVICE AND SEMICONDUCTOR MEMORY DEVICE APPLICABLE TO THE METHOD

BACKGROUND OF THE INVENTION

This invention relates to a semiconductor memory device that can carry out error detection and error correction with an error correcting code and to a method of testing the semiconductor memory device.

In a semiconductor memory device of the type described, data sets or words are kept on an array of memory cells in the form of either a pattern of charges stored therein or a voltage level distribution held therein. Each data set might fluctuate and cause an error to occur in the semiconductor memory device when each data set includes an undesirable noise. Such an error is called a soft error temporarily appearing in each data set and should be distinguished from a hard error indicative of a physical error.

In order to avoid an influence owing to such a soft error, it is known in the art to execute error correction which guarantees a proper data set free from an error when each data set is read out of the semiconductor memory device. The error correction is practically carried out with an error correction code written together with every one of data sets or word in the semiconductor memory device. More specifically, such a semiconductor memory device is operated in a write-in operation so that the error correction code is generated in response to each data set given as a write-in data set and is memorized in a memory section together with the write-in data set. In a readout operation, each data set is read out of the memory section to be decoded by the use of the corresponding error correction code into a readout data set. On decoding each data set read out of the memory section, an error is corrected by the use of the error correction code, if any. As a result, the readout data set which is subjected to error correction is produced from the semiconductor memory device.

To this end, the memory section in the semiconductor memory device has a data cell array and an error correction code cell array for memorizing the data sets and the corresponding error correction codes, respectively. In addition, the semiconductor memory device has an error correction code generator for generating an error correction code in response to each data set and a checking or decoding unit for decoding each data set read out of the memory section into the readout data set by the use of the error correction code.

Such a semiconductor memory device is very effective to read out a correct word even when a single error takes place in a memory cell. Herein, the above-mentioned write-in operation and readout operation will be collectively called a normal mode of operation for convenience of description.

In order to guarantee that such a normal mode is precisely executed, it has been considered that no hard error should be accepted and left in the memory section of the semiconductor memory device. Therefore, each of the data cell array and the error correction code cell array should be precisely tested so that no hard error is present in the data cell array and the error correction code cell array. For this purpose, each semiconductor memory device is usually checked by a test mode to guarantee absence of any hard error after it is manufactured. In other words, the semiconductor memory device is handled as an inferior product and is discarded. This results in a degradation of a yield of such a semiconductor memory device.

Under the above-mentioned consideration, disclosure is made in Japanese Unexamined Patent Publication No. Hei 5-54697, namely, 54697/1993 about testing such a semiconductor memory device which has a data cell array and an error correction code array. In the semi-conductor memory device, the data cell array and the error correction code array are individually controlled in the test mode to independently write a data set and an error correction code and to independently read them. Such independent write and read operation are helpful to detect whether or not each of the data cell array and the error correction code cell array is normal. Thus, the error correction code is very helpful to detect and correct each soft error in the semiconductor memory device.

However, the inventor has now been aware of the fact that occurrence of such a soft error is very rare or scarce in a recent semiconductor memory device due to development of a technique of preventing occurrence of such a soft error. This means that such an error correction code may not be always restricted to correction of only the soft error.

Under the circumstances, the above-referenced conventional testing method can not always effectively utilize an error correction code to test such a semiconductor memory device which hardly causes an error to occur. This is because the above-referenced conventional testing method is used only on a precondition that only the soft error is corrected by such an error correction code and besides, the precondition for the above testing method is remote from and is not matched with an actual situation.

SUMMARY OF THE INVENTION

It is, therefore, an object of this invention to provide a testing method, which is suitable for a semiconductor memory device which can execute error correction by the use of an error correction code.

It is another object of this invention to provide a semiconductor memory device which is applicable to the suitable method mentioned above.

According to the present inventor's experimental studies, it has been found out that, even when a hard error or errors might be present in each data set or word of the semiconductor memory device using the error correction code, such error or errors can be substantially corrected by the use of the error correction code if the number of errors does not exceed correction ability of the error correction code. In this event, such a semiconductor memory device can be normally utilized by customers without any problem. Herein, the error correction code in the normal mode of operation will be called a normal error correction code for convenience of description.

Taking the above into consideration, a testing method to which this invention is applicable is for use in testing a semiconductor memory device which comprises a memory section composed of a data cell array and an error correction code cell array for memorizing a data set and a normal error correction code, respectively, and which carries out error correction with the normal error correction code corresponding to said data set and having correction ability to correct a predetermined number of errors. The method according to this invention comprises the step of checking whether or not errors which exceed the correction ability occur in the memory section to judge that the semiconductor memory device in question is normal when errors occurring therein do not exceed the correction ability.

In the testing method of this invention, specifically, the checking step comprises the following three steps and is carried out with the normal error correction code unused. The first step of the checking is for storing data sets and test data sets into the data cell array and the error correction code cell array, respectively. The second step of the checking is for generating a test error correction code which has test correction ability equal to the correction ability of the normal error correction code and which is concerned with a combination of each data set and each test data set corresponding to each data set. And the third step of checking is for correcting errors in each combination with reference to the test error correction code to obtain an error corrected combination and to judge that the semiconductor memory device in question is normal when the errors in the error corrected combination do not exist.

According to this method, the semiconductor memory device may be tested only by checking whether or not the error corrected combination is coincident with the combination of each data set and each test data set, in order to judge that the semiconductor memory device in question is normal when errors occurring therein do not exceed the correction ability.

BRIEF DESCRIPTION OF THE DRAWINGS

FIG. 6 shows a test code which is used in each embodiment of this invention;

DESCRIPTION OF THE PREFERRED EMBODIMENT

Figure 1:
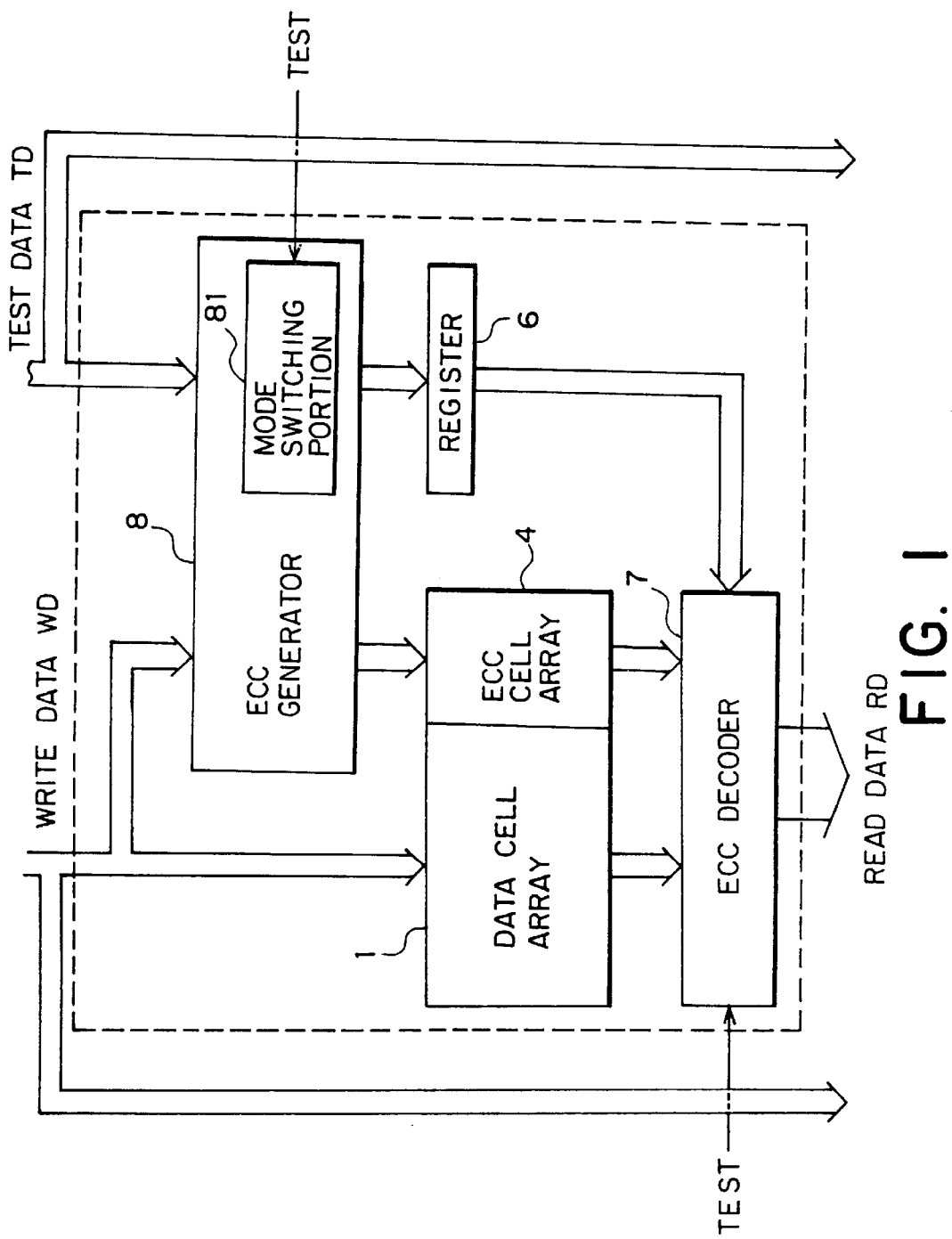
FIG. 1 is a block diagram for use in schematically describing a semiconductor memory device according to a first embodiment of this invention.

Now, description will be made about a testing method of this invention and a semiconductor memory device which is capable of being tested the test method, referring to drawings.

Briefly, the method according to this invention is for testing a semiconductor memory device to determine whether an uncorrectable error which can not be corrected by an error correction code is caused to occur in each data set or word. In this event, it is to be noted that the semiconductor memory device has a function of error correction and is operable in a normal mode to write/read each data set in the form of a word and in a test mode which will be described later in detail.

In the normal mode of operation, each data set which is written into a memory section together with the normal error correction code is read out of the data cell array to be decoded by the use of the normal error correction code, as mentioned above. With this structure, it is possible to generate an error corrected data set as a normal data set even when each data set read out of the memory section includes an error or errors within correction ability of the normal error correction code.

Herein, it is to be noted that the error corrected data set or the normal data set can be produced even when a hard error or errors might be caused to occur in the semiconductor memory device on the condition that the number of the error does not exceed the correction ability of the normal error correction code. In other words, the semiconductor memory device may not be completely free from a hard error or errors when the number of errors is smaller than the correction ability of the normal error correction code. This means that the memory section which is composed of the data cell array and the error correction code array may be checked out in the test mode about whether or not the number of errors in each data set or word exceed the correction ability of the normal error correction code.

Under the circumstances, a combination of each data set and an test data set, which is memorized in the data cell array and the error correction code cell array, is tested in the test mode of operation to check whether or not the number of error or errors is smaller than the correction ability of the normal error correction code at each combination. To this end, a test error correction code which has correction ability not higher than the correction ability of the normal error correction code is generated in the test mode in connection with each combination of the data set and the test data set. From this fact, it is readily understood that the test error correction code serves to correct an error or errors in each combination of the data set and the test data set.

Herein, it is to be noted that, if the test error correction code corrects errors occurred in each combination which is read out of the semiconductor memory device as a word, the normal error correction code can correct the errors. In such a test mode, let each combination of the data set and the test data set written into both the data cell array and the error correction code cell array of the semiconductor memory device together with the test error correction code be identical with the data set and the test data set which are read from the semiconductor memory device and which are decoded by the use of the test error correction code. In this case, the semiconductor memory device is judged as a satisfying product since no uncorrectable error of the normal error correction code is included in the semiconductor memory device.

On the other hand, if the write-in combination and the readout and decoded combination are not identical with each other, the semiconductor memory device is judged as a defective product since it is considered that the device is very likely to contain uncorrectable error of the normal error correction code.

Referring to FIG. 1, description will be made about the semiconductor memory device of this invention which has a structure applicable to this test method. It is assumed that each of the normal and the test error correction codes is composed of a hamming code which has ability to detect and to correct a single error and is formed by a plurality of check bits. Specifically, such a hamming code can correct only one bit error per word and may be often called hamming code check bits.

In the illustrated semiconductor memory device, an error correction code (abbreviated to ECC hereinafter) generator 8 is operable in response to a test signal to generate different codes depending on whether the test signal is present or not. Specifically, the ECC generator 8 comprises a mode switching portion 81 to switch the generating modes of the ECC generator 8 from one to another. In the presence of the test signal, the semiconductor memory device is put into the test mode and the test is started. In the absence of the test signal, the semiconductor memory device is put into the normal mode to execute the write/read operation. Alternatively, the mode switching portion 81 may be also switched by the test signal which takes a logic value "0" or "1".

In the illustrated example, the mode switching portion 81 switches the ECC generator 8 to the test mode during reception of the test signal TEST. In the test mode of operation, the ECC generator 8 is operable in response to a combination of the test data set TD and the write data set WD, and generates the test ECC check bits corresponding to the combination of the TD and the WD. The test ECC check bits are delivered to and stored in a register 6. The test ECC check bits have test correction ability equal to the correction ability of the normal error correction code, and are different from the normal error correction code. At this time, the ECC generator 8 writes the test data set TD into the ECC cell array 4. On the other hand, the write data set WD is written into the data cell array 1.

In FIG. 1, the test signal is also given to the ECC decoder 7. Responsive to the test signal, the decoder 7 decodes a data combination from the data cell array 1 and the ECC cell array 4 by using the test ECC check bits from the register 6 into a decoded data combination which is produced as a read data set RD.

The read data set RD is regarded as normal even if the semiconductor memory device contains one bit error per word, because such a single bit error can be corrected by utilizing the test ECC check bits. However, the read data set RD is regarded as abnormal if the semiconductor memory device contains more than two bit errors per word, because the errors can not be corrected by the test ECC check bits formed by the hamming code. Thus, the semiconductor memory device can be easily tested by comparing the read data set RD decoded and the data combination or set written into the data cell array 1 and the ECC cell array 4.

As mentioned above, if the read data set RD decoded and the data combination written into the data cell array 1 and the ECC cell array 4 are regarded as identical, the semiconductor memory device are judged as a normal product. In this event, the semiconductor memory device should have no errors which exceed the correction ability of the normal ECC since the normal ECC has the same correction ability as the test ECC, namely, a single bit error per word. If both data are not regarded as identical, the semiconductor memory device are considered to have the number of errors that can not be corrected by either the test ECC and the normal ECC. Therefore, the semiconductor memory device is judged as a defective product since the device contains more than two bit errors per word.

At this time, the data combination of the write data set WD and test data set TD) and the read data set RD may be compared with each other either outside of the semiconductor memory device or inside the device by separately setting up a comparison circuit for the test.

In the normal mode of operation, the semiconductor memory device of this invention is operable like conventional semiconductor memory devices in a manner to be described below.

During no reception of the test signal, the mode switching portion 81 switches the ECC generator 8 to put the illustrated semiconductor memory device into a normal mode of operation. In the normal mode of operation, receiving the write data set WD, the ECC generator 8 generates the normal ECC check bits and supplies the generated normal ECC check bits to the ECC cell array 4. At this point, a certain dummy data set as a test data set TD may be either input or not, and the output to the register 6 may be either done or not. However, it is preferred that the test data set and the output set to the register 6 are fixed to acceptable values in order for the semiconductor memory device to function correctly.

As understood from the above explanation, the ECC generator 8 supplies different data sets to the ECC cell array 4, referring to the test data set in the test mode of operation or the normal ECC check bits in the normal mode of operation. For a better explanation, the data set that the ECC generator 8 outputs to the ECC cell array 4 is generically called a particular data set composed of either the normal ECC check bits in the normal mode of operation or the test data set TD in the test mode of operation. Accordingly, it can be said that the ECC cell array 4 stores the particular data set. In the normal mode of operation, the ECC cell array 4 sends the normal ECC check bits as the particular data set to the ECC decoder 7.

In the normal mode of operation, the ECC decoder 7 decodes the data set from the data cell array 1 by utilizing the normal ECC check bits, and outputs the decoded data set as the read data set RD. Thus, the ECC decoder 7 also functions like conventional the ECC decoder during absence of the test signal. Only when the test signal is input, the ECC decoder 7 of the semiconductor memory device decodes the data set in a different manner.

Now, description of a semiconductor memory device according to preferred embodiment of this invention will be made with reference to drawings in order to supplement the above mentioned general explanation of this invention.

Figure 2:
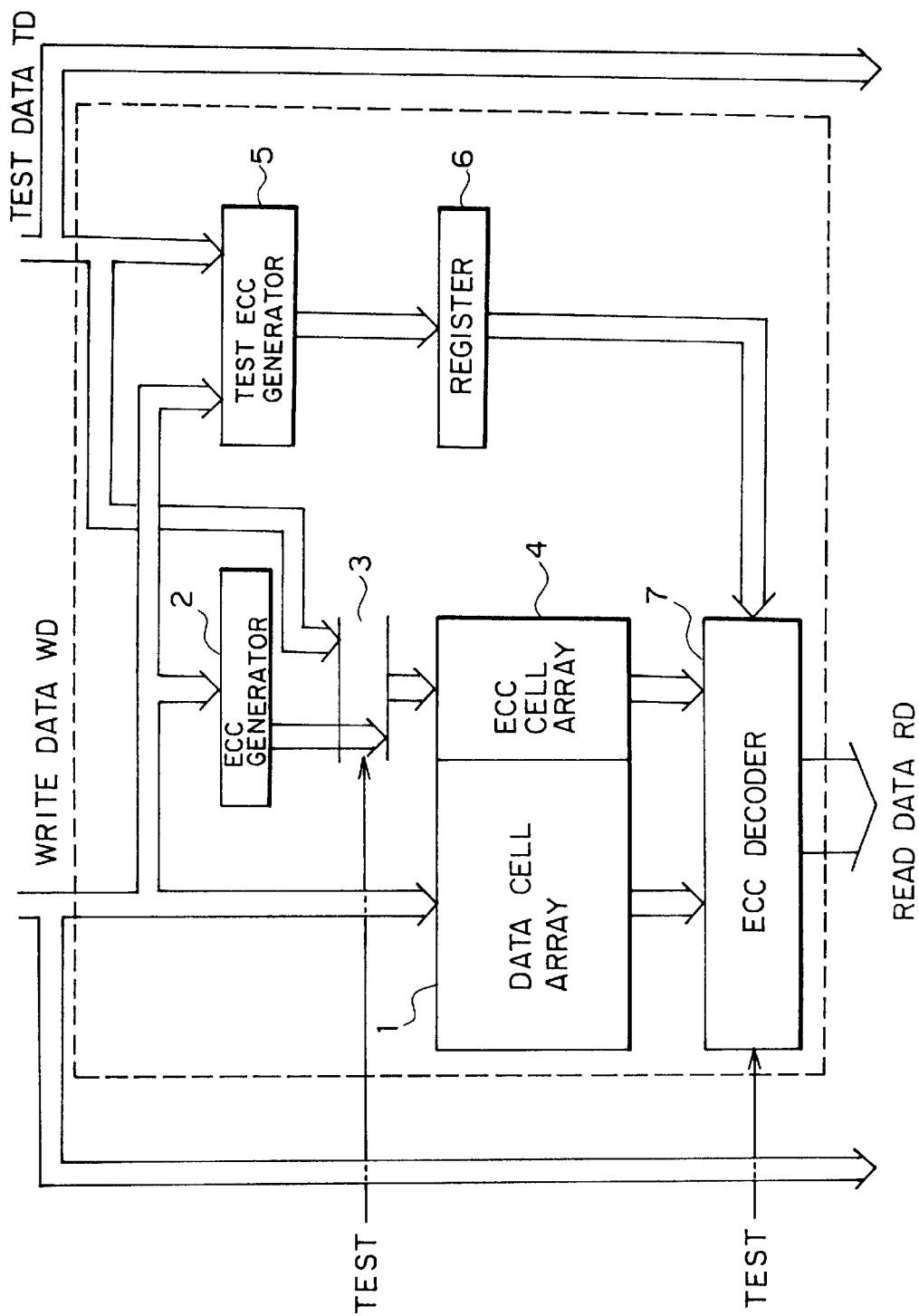
FIG. 2 is a block diagram of a semiconductor memory device according to a preferred embodiment of this invention.

The semiconductor memory device according to the preferred embodiment of this invention has a structure shown in FIG. 2.

In FIG. 2, the ECC generator 8 shown in FIG. 1 is specified by an ECC generator 2, a selector 3, and a test ECC generator 5. Other components function like those in FIG. 1. The ECC generator 2 generates the normal ECC check bits in response to the write data set WD to supply the normal ECC check bits to the selector 3. The illustrated selector 3 receives the test data set TD and the normal ECC check bits and selects either one of the data as the particular data set by referring to the test signal, and supplies the selected data set to the ECC cell array 4. The test ECC generator 5 receives the write data set WD and test data TD, and generates the test ECC check bits calculated on the basis of both the write data set WD and the test data set TD to supply the test ECC check bits to the register 6.

Specifically, each component shown in FIG. 2 is operated in a manner to be described below.

The data cell array 1 forms the memory section together with the ECC cell array and receives and stores the input write data set WD.

In the normal mode, the ECC generator 2 receives the write data set WD and generates the normal ECC check bits corresponding to the write data set WD.

The selector 3 selects the normal ECC check bits generated by the ECC generator 2 to send the normal ECC check bits as the particular data set to the ECC cell array 4 in the normal mode of operation. On the other hand, the selector 3 selects the test data set TD to supply the test data set TD as the particular data set to the ECC cell array 4 in the test mode of operation.

The ECC cell array 4 receives and stores the particular data set selected by the selector 3. As a result, the ECC cell array 4 stores the test data set TD in the test mode of operation, and stores the normal ECC check bits in the normal mode of operation.

Responsive to the write data set WD and the test data set TD, the test ECC generator 5 generates the test ECC check bits that are used in the ECC decoder 7 in the test mode.

The register 6 temporarily stores the test ECC check bits generated by the test ECC generator 5. In this event, the register 6 may have a word capacity which is decided by each combination of the write data set WD and the test data set TD. For instance, when the semiconductor memory device is tested with a stripe pattern composed of "0000 data" and "1111 data" or a checker board pattern composed of "5555h data" and "AAAAh data." Under this condition, the register 6 may have a capacity of a two-word.

Responsive to the test signal TEST, which starts the device test, the ECC decoder 7 carries out error detection and error correction of a data combination sent both from the data cell array 1 and the ECC cell array 4 by utilizing the test ECC check bits sent from the register 6, and produces the result as the read data set RD.

In the normal mode of operation, the ECC decoder 7 carries out error detection and error correction of the data set from the data cell array 1 by utilizing the normal ECC check bits sent from the ECC cell array 4 and produces the result as the read data set RD.

After the manufacture of the semiconductor memory device of this embodiment, the data cell array 1 and the ECC cell array 4 are operated like a single cell array, and each word of the single memory cell array is produced in the test mode.

As a result of the test, if less than one bit error is found in each word of the single memory cell array, the semiconductor memory device are regarded as a normal product. If more than two bit errors are found in each word of the single memory cell array, the semiconductor memory device are regarded as a defective product.

As understood from the above, the distinctive point of this embodiment is that the data cell array 1 and the ECC cell array 4 are regarded as a single memory cell array, and that the single memory cell array are tested by separately setting up an error correction function for the test.

Figure 3:
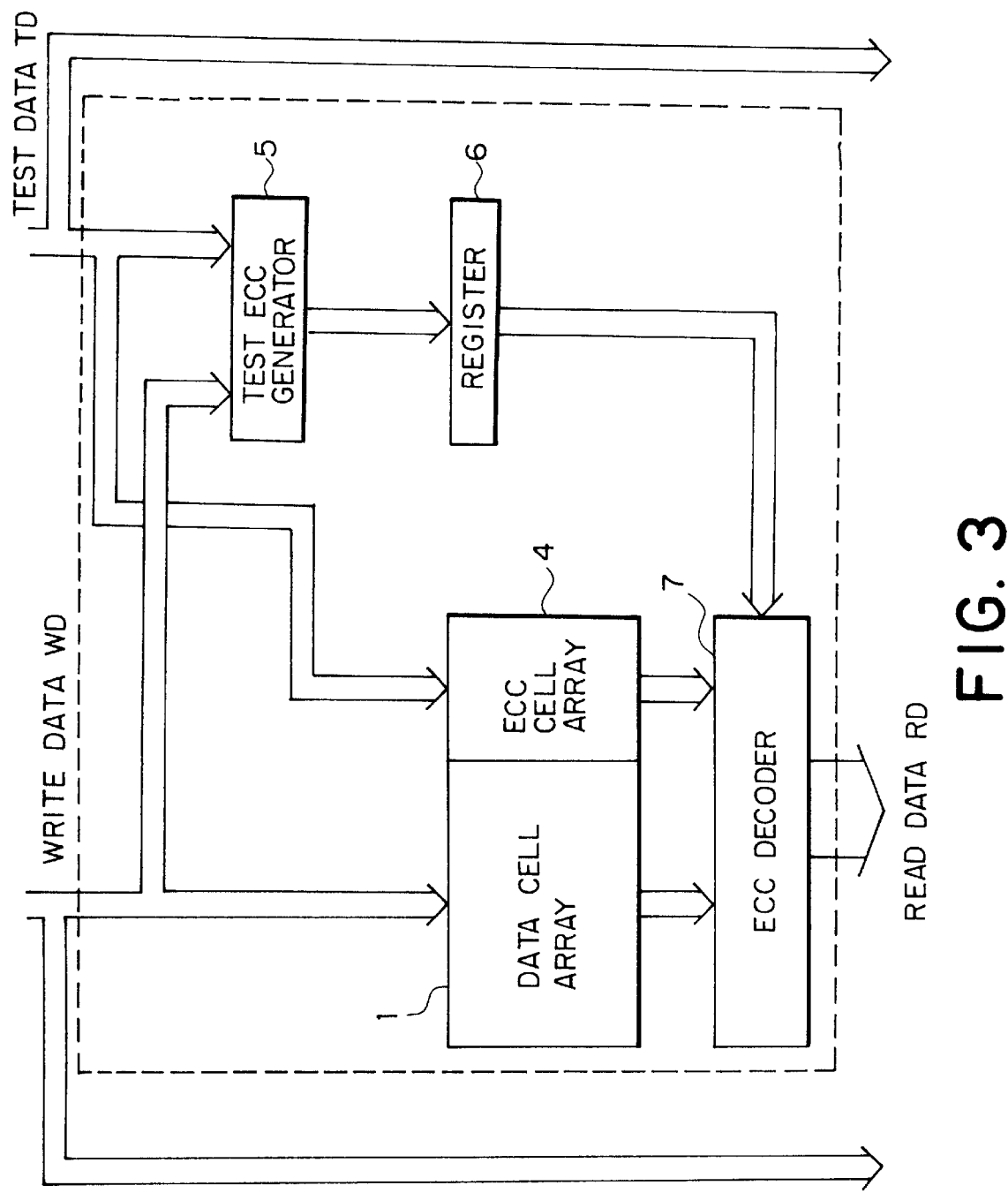
FIG. 3 is a block diagram for use in describing a test operation of the semiconductor memory device shown in FIG. 2.

FIG. 3 only shows components that is operated when the test signal is given. In FIG. 3, description will be made about the test mode of operation which is executed in response to the test signal TEST given to the selector 3 and the ECC decoder 7. Though the selector 3 is omitted from this figure for a better understanding of the test mode, the selector 3 actually selects the test data set TD and sends it to the ECC cell array 4. The ECC decoder 7 decodes the data set from the data cell array 1 and the ECC cell array 4 by utilizing the test ECC check bits sent from the register 6.

In the test mode, the data cell array 1 receives and stores the write data set WD, and the ECC cell array 4 receives and stores the test data set TD selected by the selector 3. For convenience of the explanation, the write data set WD and the test data set TD are collectively called a predetermined data set as mentioned before.

The test ECC generator 5 receives the predetermined data set, generates the test ECC check bits corresponding to the predetermined data set, and supplies the test ECC check bits to the register 6.

The ECC decoder 7 recognizes the data cell array 1 and the ECC cell array 4 as a single memory cell array, and carries out error detection and error correction of the data combination read out of the single memory cell array by referring to the test ECC check bits delivered from the register 6. The results of the error detection and the error correction are produced as the read data set RD.

As mentioned above, the read data set RD is compared with the data combination written in the single memory cell array, and then, the semiconductor memory device is judged as a normal product if both data set or combination is considered identical. In the semiconductor memory device of this embodiment, even if each word in the single memory cell array contains one bit error per word, the error is corrected by the test ECC check bits.

Figure 4:
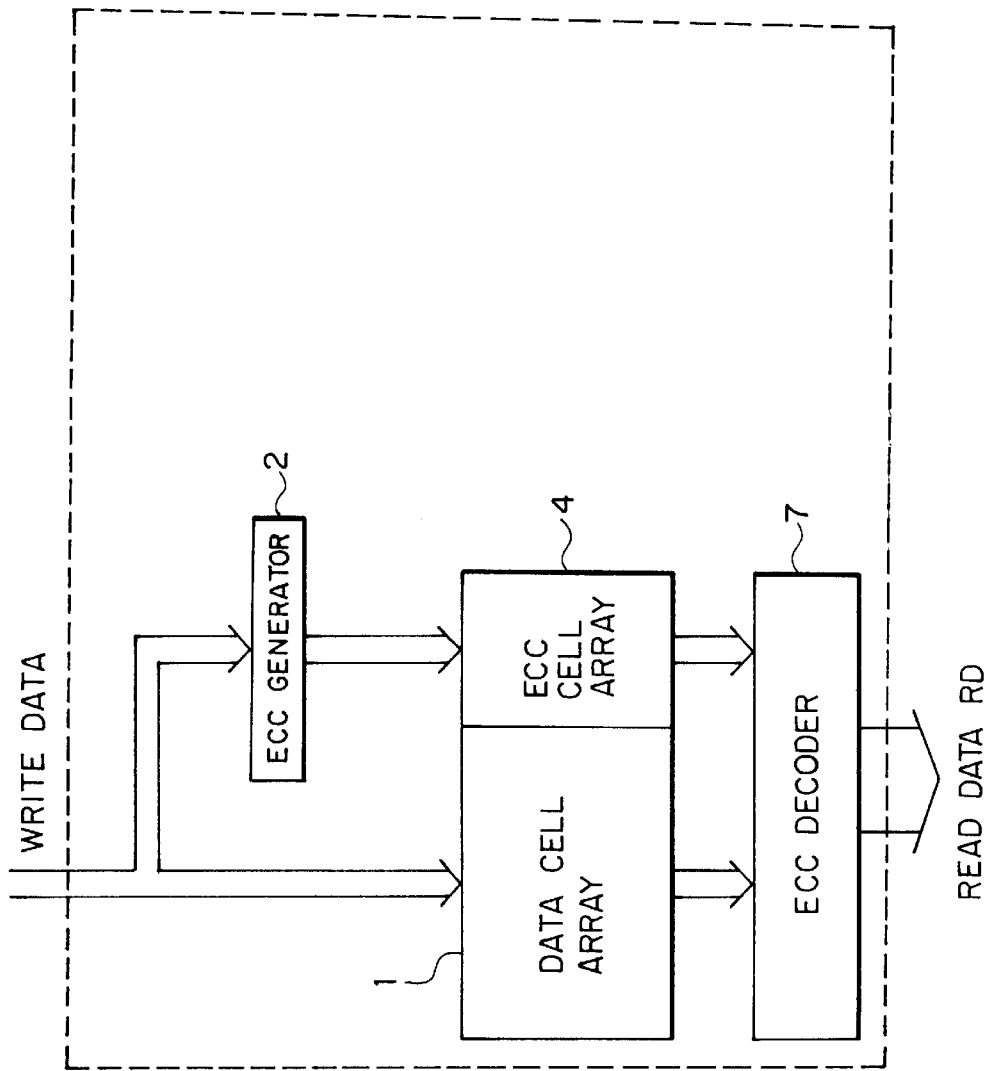
FIG. 4 is a block diagram for use in describing a normal write and read operation of the semiconductor memory device shown in FIG. 2.

In this case, let the read data set RD from the ECC decoder 7 have normal contents, that is, the same data set as the predetermined data set. In this event, the semiconductor memory device of this embodiment is tested only by judging whether or not the data combination of the write data set WD and the test data set TD are identical to or coincident with the read data set RD. This means that the semiconductor memory device is regarded as a normal product if the device has less than one bit error per word. Judged as a satisfying product and shipped, the semiconductor memory device performs normal operation, namely, normal memory operation, as shown in FIG. 4.

In the normal mode of operation, the data cell array 1 receives and stores a write data set WD. The ECC generator 2 receives the write data set WD, generates the normal ECC check bits corresponding to the write data set WD, and supplies the normal ECC check bits to the ECC cell array 4 through the selector 3. The selector 3 which is omitted from FIG. 4 selects the normal ECC check bits generated by the ECC generator 2 and supplies the normal ECC check bits to the ECC cell array 4.

The ECC decoder 7 carries out error detection and error correction of the data set read out of the data cell array 1 by utilizing the normal ECC check bits sent from the ECC cell array 4 and accordingly produces the read data set RD. At this case, even if one bit error per word occurs in the data set read out of the data cell array 1, such a single error is corrected by the normal ECC check bits.

Next, a further explanation of the ECC decoder 7 in the semiconductor memory device of this embodiment will be made with FIG. 5.

Figure 5:
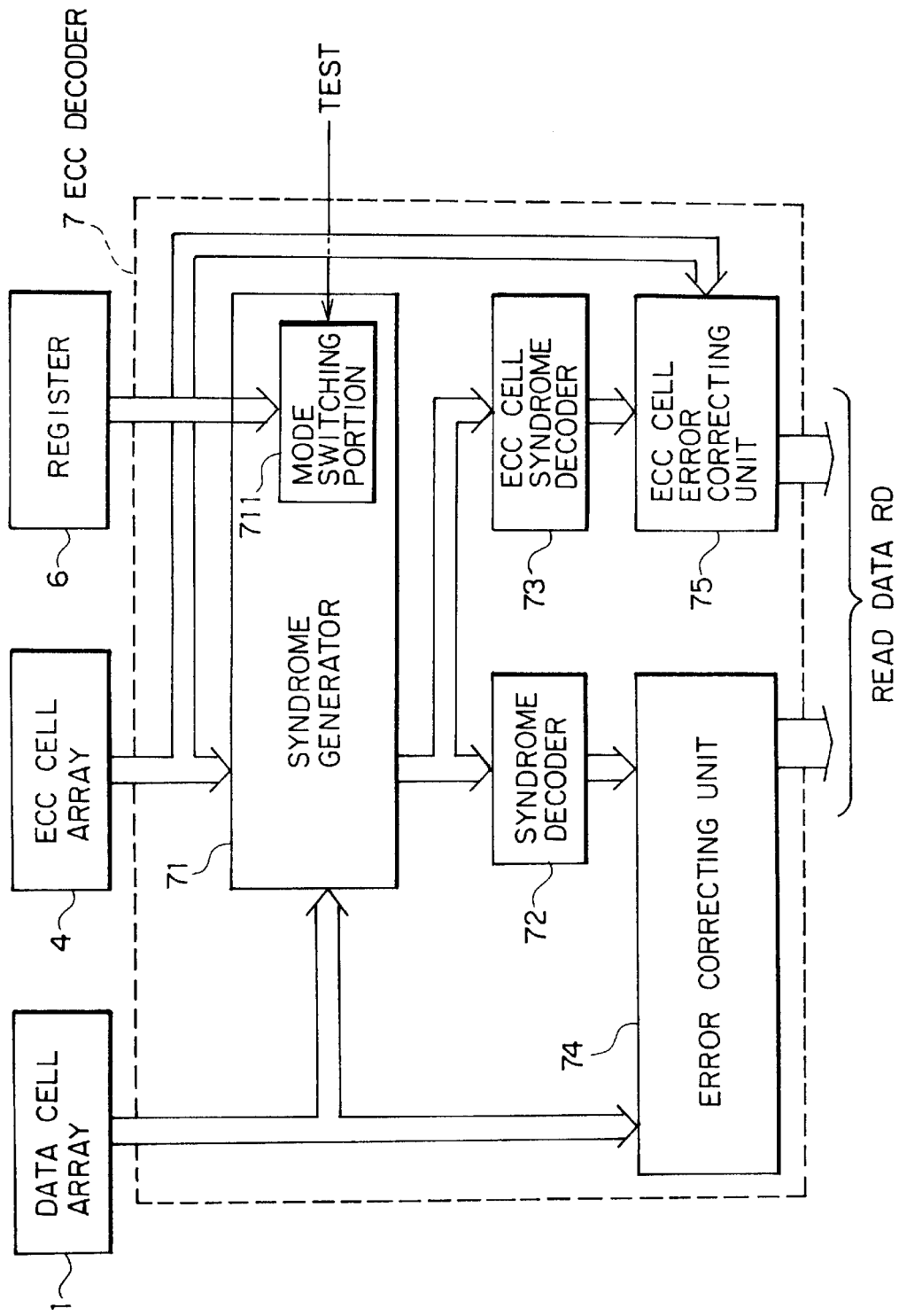
FIG. 5 is a block diagram for use in describing a error correction code decoder of the semiconductor memory device shown in FIG. 2.

The ECC decoder illustrated in FIG. 5 comprises a syndrome generator 71 which generates different syndromes determined by a bit position of the error in response to the test signal. Therefore, the illustrated syndrome generator 71 comprises a mode switching portion 711. Once the test signal is input, the syndrome generator 71 generates a syndrome data set representative of each syndrome in response to the data combination from the data cell array 1 and the ECC cell array 4 together with the test ECC check bits from the register 6. On the other hand, the syndrome generator 71 generates the other syndrome in response to the data set from the data cell array 1 and the normal ECC check bits from the ECC array 4.

A syndrome decoder 72 and an ECC cell syndrome decoder 73 receive and decode the syndrome from the syndrome generator 71, and then supply the decoded syndrome to an error correcting unit 74 and an ECC cell error correcting unit 75, respectively.

The error correcting unit 74 carries out error correction by receiving the decoded syndrome from the syndrome decoder 72, which indicates an error pattern. If the error correcting unit 74 does not detect any error of the data from the data cell array 1, all data remain unchanged in the unit. If the error correcting unit 74 detects one bit error, the unit corrects the error and produces the error correction data set as the parts of the read data set RD.

Likewise, the error correcting unit 75 carries out error detection by receiving the data set from the ECC cell array 4 and the decoded data set from the ECC cell syndrome decoder 73. This error detection is executed in a manner similar to that of the error detection in the error correcting unit 74. The error corrected data set is produced as other part of the read data set RD.

The data set from the error correcting unit 74 and the ECC cell error correcting unit 75, make up the read data set RD, and are used for the above mentioned test. In the above explanation the hamming code has been exemplified as the ECC, but any other ECCs are applicable to the test as far as the ECC can correct an error or errors per word on detection of such error or errors.

Now, a further explanation of the semiconductor memory device according to this invention will be made below in connection with a concrete example of check matrix H and a concrete circuit structure associated with the matrix H. The illustrated check matrix H is shown in FIG. 6, while the ECC generator 8 the syndrome generator 71 are specifically shown in FIGS. 7 and 8, respectively. Furthermore, the syndrome decoder 72 and the ECC cell syndrome decoder are specifically exemplified in FIG. 9, while the error correcting unit 74 and the ECC cell error correcting unit 75 are specifically shown in FIG. 10.

In the following example, it is assumed that the data cell array 1 is designed to store a word of eight bits, and accordingly the ECC cell array 4 and the register 6 are designed to store four bits and five bits, respectively. If the data cell array 1 is designed to store a word of sixteen bits, the ECC cell array 4 and the register 6 must have bit capacities of five bits and six bits, respectively. If the data cell array 1 is designed to store a word of thirty two bits, the ECC cell array 4 and the register 6 should have bit capacities of six bits and seven bits, respectively.

Figure 7:
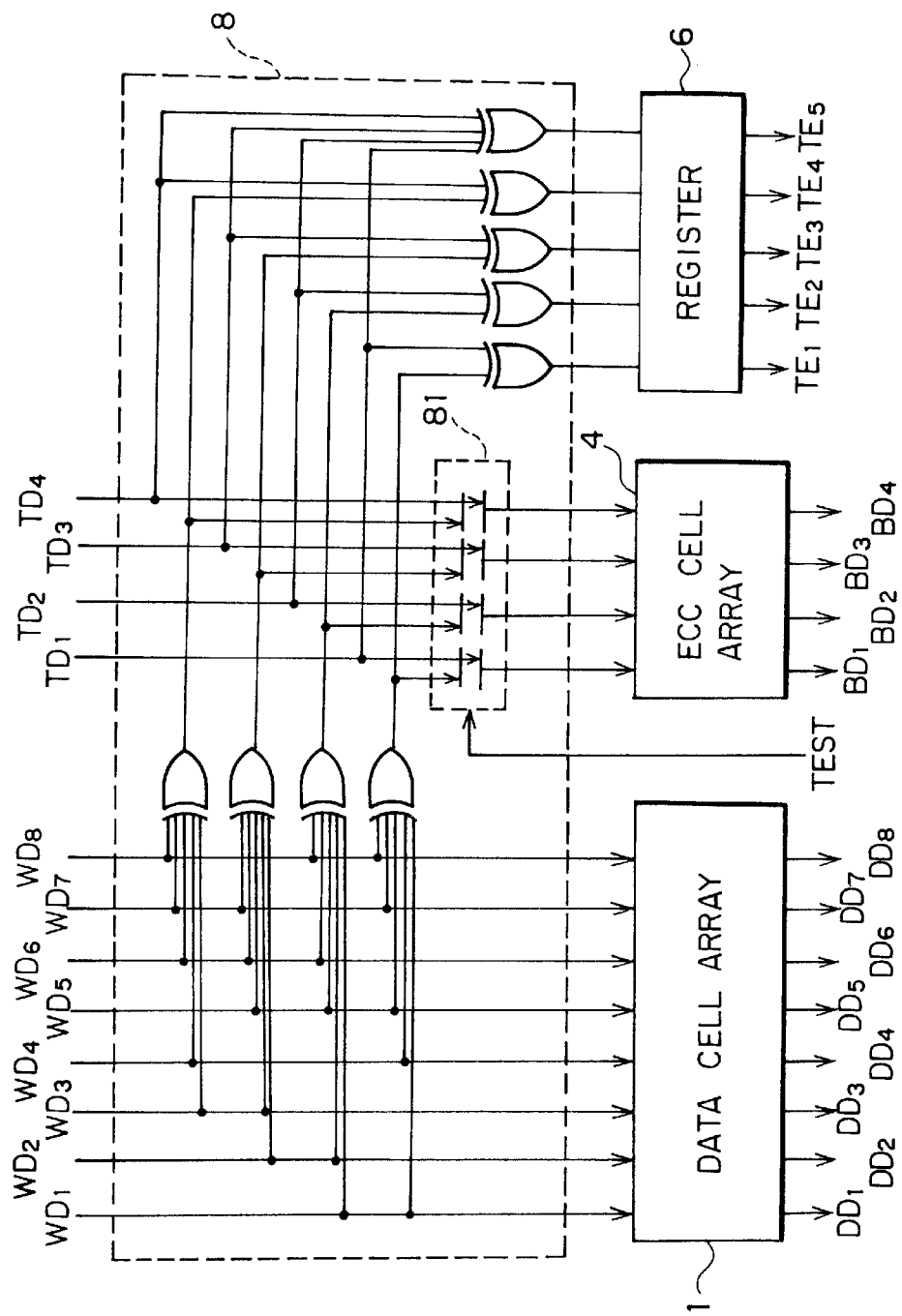
FIG. 7 is a circuit diagram for use in describing an error correction code generator used in each embodiment of this invention.

As shown in FIG. 7, in the normal mode of operation, the ECC generator 8 receives the first to the eighth write data bits $WD_1$~$WD_8$ and generates the first to the fourth normal ECC check bits. The first to fourth normal ECC check bits generated by the ECC generator 8 are supplied to the ECC cell array 4 through the mode switching portion 81 consisting of the selectors.

The first to the fourth normal ECC check bits are generated as follows. The first normal ECC check bit is generated as a result of an exclusive OR operation among the first, the fourth, the fifth, the seventh, and the eighth write data bits, $WD_1$, $WD_4$, $WD_5$, $WD_7$, and $WD_8$. The second normal ECC check bit is generated as a result of an exclusive OR operation among the first, the second, the fifth, the sixth, and the eighth write data bit, $WD_1$, $WD_2$, $WD_5$, $WD_6$, and $WD_8$. Likewise, the third normal ECC check bit is generated as a result of an exclusive OR operation among the second, the third, the fifth, the sixth, and the seventh write data bit, $WD_2$, $WD_3$, $WD_5$, $WD_6$, and $WD_7$. Similarly, the fourth normal ECC check bit is generated as a result of an exclusive OR operation among the third, the fourth, the sixth, the seventh, and the eighth write data bit, $WD_3$, $WD_4$, $WD_6$, $WD_7$, and $WD_8$.

On the other hand, in the test mode of operation, the ECC generator 8 receives the first to the eighth write data bits $WD_1$~$WD_8$ and the first to the fourth test data bits $TD_1$~$TD_4$, and generates the first to the fifth test ECC check bits. Specifically, the first to the fourth test ECC check bits are generated as a result of the exclusive OR of the first to the fourth normal ECC check bits generated by the same process in the normal mode of operation and the first to the fourth test data bits $TD_1$~$TD_4$ corresponding to those normal ECC check bits, respectively. The fifth test ECC check bit is generated by carrying out an exclusive OR among the test data bits $TD_1$~$TD_4$. The first to the fifth test ECC check bits generated in the above process are supplied to the register 6. In this process, the first to the fourth test data bits $TD_1$~$TD_4$ are sent to the ECC cell array 4 through the mode switching portion 81.

The data cell array 1 produces the first to the eighth cell data bits $DD_1$~$DD_8$ that have the same values as the first to the eighth write data bits $WD_1$~$WD_8$, respectively.

The ECC cell array 4 produces the first to the fourth ECC cell data bits $BD_1$~$BD_4$ that have the same values as the particular data set given through the mode switching portion 81. Therefore, the first to the fourth ECC cell data bits $BD_1$~$BD_4$ produced by the ECC cell array 4 are generated as the first to the forth normal ECC check bits in the normal mode of operation, and are generated as the first to the fourth test data bits $TD_1$~$TD_4$ in the test mode of operation.

The first to the fifth register data bits $TE_1$~$TE_5$ sent from the register 6 serve as the first to the fifth test ECC check bits.

Figure 8:
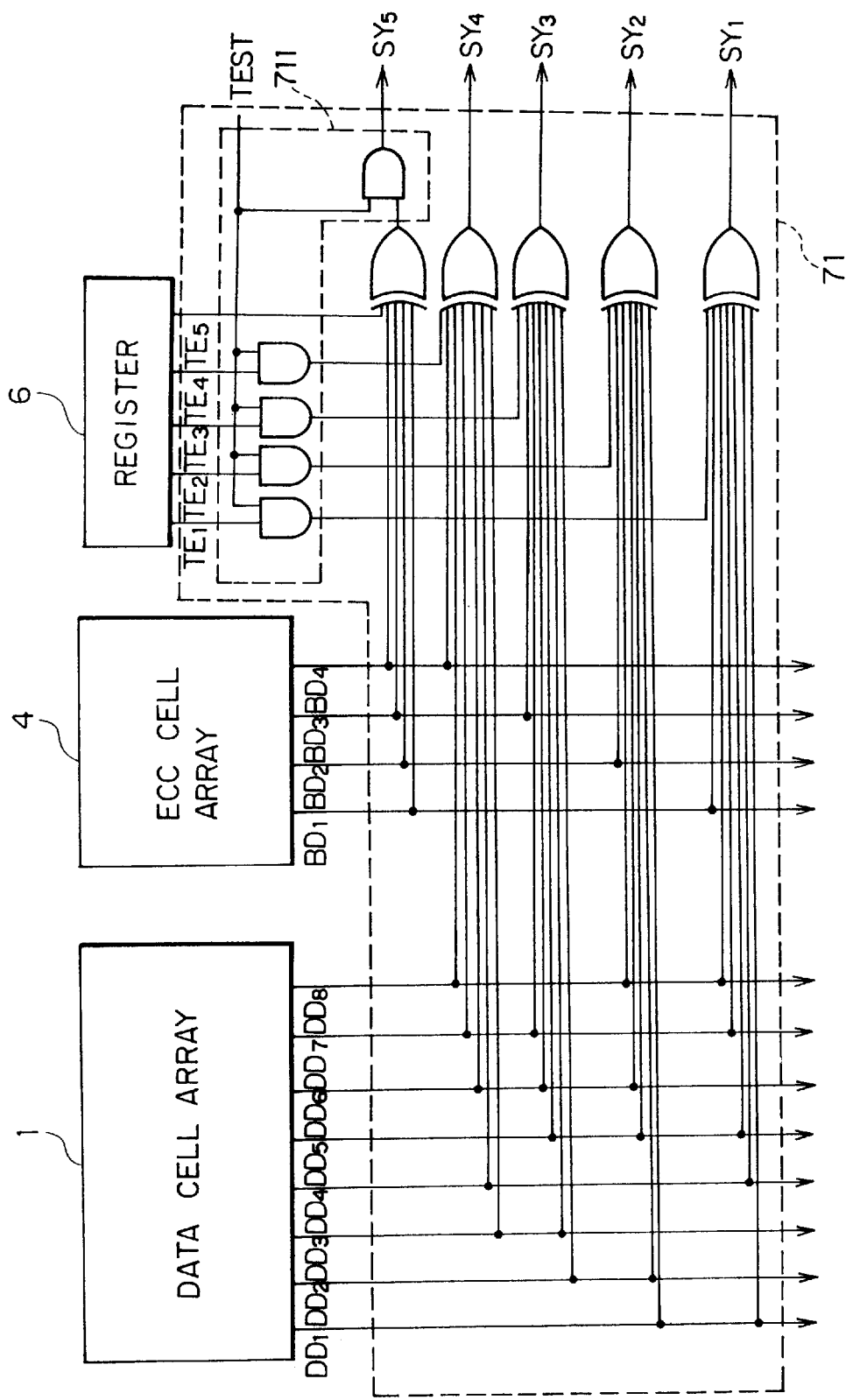
FIG. 8 is a circuit diagram for use in describing a syndrome generator used in each embodiment of this invention.

As shown in FIG. 8, the syndrome generator 71 comprises a mode switching portion 711 to vary a code that the syndrome generator 71 generates in response to a test signal. Once a test signal is input, the mode switching portion 711 becomes ready for the test, selects the first to the fourth register data bits $TE_1$~$TE_4$, and produces the fifth syndrome data bit $SY_5$ generated by the register data $TE_5$ and other signals. On the other hand, in the normal mode of operation, the mode switching portion 711 converts the first to the fourth register data bits $TE_1$~$TE_4$ into "0" and produces those data bits. At the same time, the mode switching portion 711 outputs the fifth syndrome data bit $SY_5$ as "0".

As understood from the above operation, the test signal according to this embodiment is shown as positive logic, and if the test signal is "L", the mode switching portion 711 outputs all "0" as the first to the fourth register data bits $TE_1$~$TE_4$ and the fifth syndrome data bit $SY_5$. On the other hand, the test signal is "H," the mode switching portion 711 outputs the first to the forth register data bits $TE_1$~$TE_4$ and the fifth syndrome data bit $SY_5$.

As a whole, the syndrome generator 71 is operable in cooperation with the mode switching portion 711 in a manner to be described below.

In the normal mode of operation, the syndrome generator 71 is supplied with the first to the eighth cell data bits $DD_1$~$DD_8$ from the data cell array 1 and the first to the fourth ECC cell data bits $BD_1$~$BD_4$ from the ECC cell array 4. The syndrome generator 71 generates the first to the fourth syndrome data bits $SY_1$~$SY_4$, and supplies these syndrome data bits to the syndrome decoder 72. In this case, the fifth syndrome data bit $SY_5$ is "0."

On the other hand, in the test mode of operation, the syndrome generator 71 is supplied with the first to the eighth cell data bits $DD_1$~$DD_8$, the first to the fourth ECC cell data bits $BD_1$~$BD_4$, and the first to the fifth register data bits $TE_1$~$TE_5$, to produce the first to the fifth syndrome data bits $SY_1$~$SY_5$.

Specifically, the first to the fifth syndrome data bits $SY_1$~$SY_5$ are generated as follows. The first syndrome data bit $SY_1$ is generated by carrying out an exclusive OR operation among the first, the fourth, the fifth, the seventh, and the eighth cell data bits, $DD_1$, $DD_4$, $DD_5$, $DD_7$, and $DD_8$, the first ECC cell data bit $BD_1$, and the first register data bit $TE_1$. The second syndrome data bit $SY_2$ is generated as a result of an exclusive OR operation among the first, the second, the fifth, the sixth, and the eighth cell data bits, $DD_1$, $D_2$, $DD_5$, $DD_6$, and $DD_8$, the second ECC cell data bit $BD_2$, and the second register data bit $TE_2$. The third syndrome data bit $SY_3$ is generated as a result of an exclusive OR operation among the second, the third, the fifth, the sixth, and the seventh cell data bits $DD_2$, $DD_3$, $DD_5$, $DD_6$, and $DD_7$, the third ECC cell data bit $BD_3$, and the third register data bit $TE_3$. The forth syndrome data bit $SY_4$ is generated as a result of an exclusive OR operation among the third, the fourth, the sixth, the seventh, and the eighth cell data bits, $DD_3$, $DD_4$, $DD_6$, $DD_7$, and $DD_8$, the forth ECC cell data bit $BD_4$, and the forth register data bit $TE_4$. And the fifth syndrome data bit $SY_5$ is generated by carrying out an exclusive OR operation among the first to the fourth ECC cell data bits $BD_1$~$BD_4$ and the fifth register data bit $TE_5$. Since the first to the fourth register data bits $TE_1$~$TE_4$ become all "0" in the normal mode of operation, the syndrome generator 71 produces the same results as the exclusive OR, in which no register data are considered. And at the same time, the syndrome generator 71 also outputs the fifth syndrome data bit $SY_5$ as "0".

Figure 9:
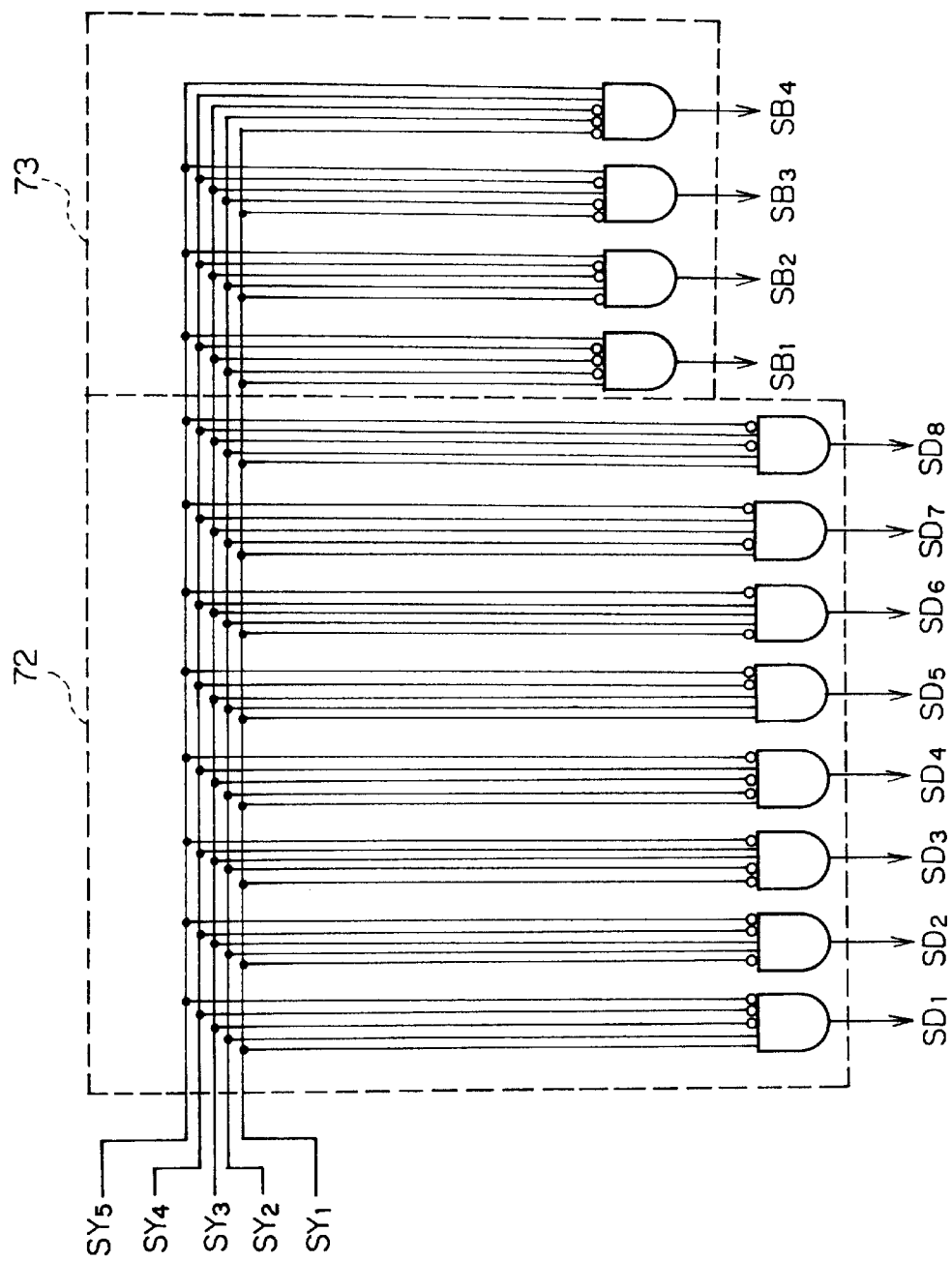
FIG. 9 is a circuit diagram for use in describing a syndrome decoder unit and an error correction code cell syndrome decoder both of which are used in the preferred embodiment of this invention.

As shown in FIG. 9, the syndrome decoder 72 receives the first to the fifth syndrome data bits $SY_1$~$SY_5$, carries out an AND operation after inverting each syndrome data bit if necessary, and generates the first to the eighth syndrome decode data bits $SD_1$~$SD_8$. The first to the eighth syndrome decode data bits $SD_1$~$SD_8$ are supplied to the error correcting unit 74.

The ECC cell syndrome decoder 73 receives the first to the fifth syndrome data bits $SY_1$~$SY_5$, and carries out an AND operation after inverting each syndrome data bit, as shown in FIG. 9, if necessary, and generates the first to the fourth ECC syndrome decode bits $SB_1$~$SB_4$. The first to the fourth ECC syndrome decode bits $SB_1$~$SB_4$ are supplied to the ECC cell error correcting unit 75.

Figure 10:
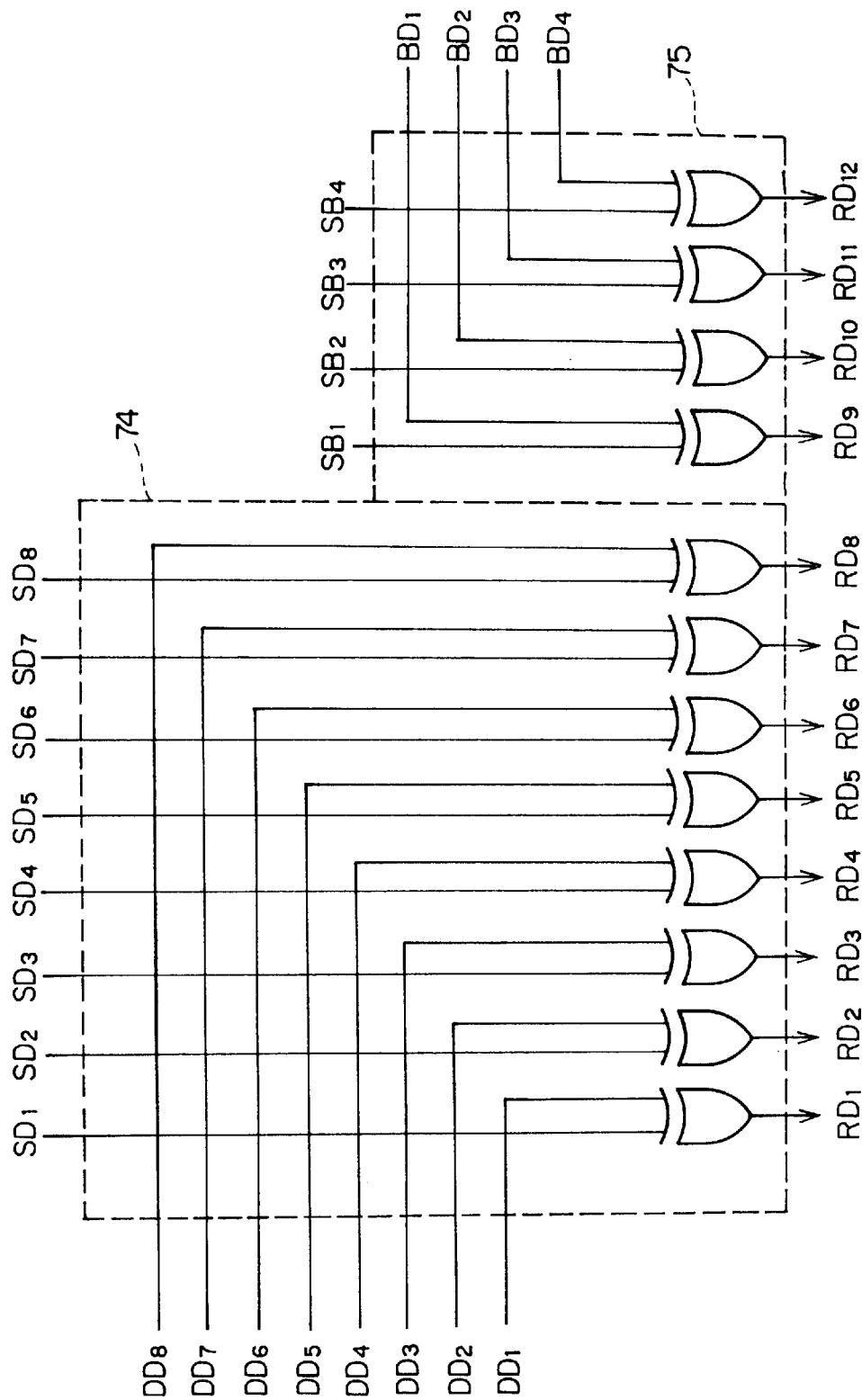
FIG. 10 is a circuit diagram for use in describing an error correcting unit and an error correction code cell error correcting unit both of which are used in the preferred embodiment of this invention.

As shown in FIG. 10, the error correcting unit 74 receives the first to the eighth cell data bits $DD_1$~$DD_8$ from the data cell array 1 and the first to the eighth syndrome decode data bits $SD_1$~$SD_8$ from the syndrome decode unit 72, carries out OR operation of the corresponding data sets, and then supplies the ORed output as the first to the eighth read data bits $RD_1$~$RD_8$.

Like the above explanation of the error correcting unit 74, the ECC cell error correcting unit 75 receives the first to the fourth ECC cell data bits $BD_1$~$BD_4$ from the ECC cell array 4 and the first to the fourth ECC syndrome decode bits $SB_1$~$SB_4$ from the ECC cell syndrome decoder 73, carries out OR operation of the corresponding data sets, and then outputs the OR as the ninth to the twelfth read data bits $RD_9$~$D_{12}$.

In the semiconductor memory device having the above mentioned structure, even if the above mentioned test of each memory cell utilizing the check matrix H shown in FIG. 6 detects an error or errors, the test can judge whether the error or the errors cause a substantially serious problem in actual use. More specifically, according to this embodiment, the test can be readily distinguished between the case that each word has less than one bit error when the data cell array 1 and the ECC cell array 4 are regarded as a single memory cell array and the case that each word has more than two bit errors.

In the above description of the embodiment, the test error correction code has the same correction ability as the normal error correction code, which is capable of correcting a single error per word. However, correction ability of the test error correction code may be not higher than the correction ability of the normal error correction code. Under the circumstances, the test error correction code can correct any errors which is equal to or smaller than the range of correction ability itself and which are naturally not beyond the correction ability of the normal error correction code. Thus, even the semiconductor memory device including the errors does not cause any serious problem in the normal use.

From the above description, it is readily understood that, according to this invention, the yield of the semiconductor memory device can be remarkably improved. Moreover, the method for the purpose is very simple.

While this invention has thus far been described in conjunction with a few embodiments thereof, it will be readily possible for those skilled in the art to put this invention into practice in various other manners. For example, it is possible to use a wide variety of code correction codes, such as a Reed-Solomon code, a BCH (Bode-Chaudhuri-Hocquenghem) code or the like, which have correction ability higher than the hamming code exemplified in the above-mentioned embodiments. This means that this invention is restricted to correction of a single error.

What is claimed is:

1. A testing method of a semiconductor memory device which comprises a memory section composed of a data cell array and an error correction code cell array for memorizing a data set and a normal error correction code, respectively, and which carries out error correction with the normal error correction code corresponding to said data set and having correction ability to correct a predetermined number of errors, comprising the steps of:

storing data sets and test data sets into the data cell array and the error correction code cell array, respectively;

preparing a register;

storing in the register a test error correction code as an error correction code for a combination of each data set and each test data set corresponding to each data set, the test error correction code having test correction ability equal to the correction ability of the normal error correction code, the test error correction code being different from the normal error correction code;

checking with the test error correction code whether or not the number of hard errors in the entirety of the memory section of the semiconductor memory device exceeds the correction ability of the normal error correction code; and judging that the semiconductor memory device is normal when the errors occurring in the entirety of the memory section do not exceed the correction ability.

2. The testing method as claimed in claim 1, wherein the checking step is carried without the normal error correction code.

3. The testing method as claimed in claim 2, wherein the checking step corrects errors in each combination with reference to the test error correction code to obtain an error corrected combination, so that the judging step judges that the semiconductor memory device is normal when the errors in the error corrected combination do not exist.

4. The testing method as claimed in claim 1, wherein the storing step comprises the steps of:
   memorizing each data set into the data cell array; and
   memorizing each test data set corresponding to each data set into the error correction code cell array at each position that corresponds to that of each data sets independently of each data set.

5. A semiconductor memory device selectively operable in a normal mode to carry out write-in and readout operations of a plurality of data sets with each of the data sets subjected to error correction by the use of a normal error correction code, and in a test mode to carry out a test operation in response to a test signal, comprising:
   a data cell array for memorizing each data set;
   an error correction code cell array which foist a memory section together with the data cell array, for memorizing the normal error correction code in the normal mode, the normal en-or correction code being concerned with each data set and having correction ability to correct a predetermined number of errors in the normal mode, the error correction code cell array storing a test data set instead of the normal error correction code in the test mode so that each data set memorized in the data cell array is not subjected to the error correction by the use of the normal error correction code in the test mode;
   a register for storing, in the test mode, a test error correction code as an error correction code for a combination of each data set and each test data set corresponding to each data set, the test error correction code having test correction ability equal to the correction ability of the normal error correction code, the test error correction code being different from the normal error correction code; and
   checking means responsive to the test signal in the test mode, for checking with the test error correction code whether or not the number of hard errors in the entirety of the memory section of the semiconductor memory device exceeds the correction ability of the normal error correction code, for producing a checked data set and for judging that the semiconductor memory device in question is normal when errors occurring in the entirety of the memory section do not exceed the correction ability of the normal error correction code.

6. The semiconductor memory device as claimed in claim 5, wherein said checking means comprises:
   an error correction code generator which is coupled to the register and is operable to generate the test error correction code in response to the combination of the each data set and the test data set corresponding to the each data set, the generated test error correction code is stored in the register; and
   an error correction code decoder coupled with the data cell array, the error correction code cell array and the register, for correcting errors occurring in a readout combination of each data set and the test data set read out of the data cell array and the error correction code cell array with reference to the test error correction code in the test mode to produce an error corrected combination as said checked data set and to judge that the semiconductor memory device is normal when the errors in the error corrected combination do not exist.

7. The semiconductor memory device as claimed in claim 6, wherein said error correction code generator further produces the selected one of the normal error correction code and the test data set to store the selected one of the normal error correction code and the test data set into the error correction code cell array, the test data set being produced in response to the test signal.

8. The semiconductor memory device as claimed in claim 6, wherein said error correction code generator has a function of generating the normal error correction code in response to each data set in the normal mode.

9. The semiconductor memory device as claimed in claim 6, wherein said error correction code decoder further corrects a readout data set read out of the data cell array as each data set with reference to the normal error correction code read out of the error correction code cell array in the normal mode.

10. The semiconductor memory device as claimed in claim 6, wherein said error correction code decoder comprises:
    a syndrome generator supplied with a readout data set as each data set read out of the data cell array, a particular data set as either one of the normal error correction code and the test data set read out of the error correction code cell array in the normal mode and in the test mode, respectively, and the test error correction code from the code generating means, for generating a syndrome data set;
    syndrome decoding means coupled with the syndrome generator, for decoding the syndrome data set to produce a decoded syndrome data set; and
    error correcting means supplied with the readout data set, the particular data set and the decoded syndrome data set, for correcting error occurring in the readout combination with reference to the decoded syndrome data set in the test mode to produce the error corrected combination.

11. The semiconductor memory device as claimed in claim 10, wherein said syndrome decoding means comprises:
    a first syndrome decoder responsive to said syndrome data set, for decoding the syndrome data set into a first decoded syndrome data set intended for the data cell array; and
    a second syndrome decoder responsive to said syndrome data set, for decoding the syndrome data set into a second decoded syndrome data set which is intended for the error correction code cell array and forms the decoded syndrome data set together with the first decoded syndrome data set.

12. The semiconductor memory device as claimed in claim 11, wherein said error correcting means comprises:
    a first error correcting unit coupled with the data cell array and the first syndrome decoder, for correcting at least one error occurring in the readout data set with reference to the first decoded syndrome data set to produce a first error corrected data set; and
    a second error correcting unit coupled with the error correction code cell array and the second syndrome decoder, for correcting at least one error occurring in the particular data set as the test data set with reference to the second decoded syndrome data set in the test mode to produce a second error corrected data set which forms the error corrected combination together with the first error corrected data set.

13. The semiconductor memory device as claimed in claim 5, wherein said checking means comprises:
    an error correction code generator supplied with each data set, for generating the normal error correction code set corresponding to said each data set;

a selector for selecting the normal error correction code in response to no test signals and the test data set in response to the test signal, to produce the selected one into the error correction cell array;

a test error correction code generator coupled to the register and adapted to generate the test error correction code in response to the combination of each data set and the test data set corresponding to said each data set; and an error correction code decoder coupled with the data cell array, the error correction code cell array and the register, for correcting errors occurring in a readout combination of each data set and the test data set read out of the data cell array and the error correction code cell array with reference to the test error correction code in the test mode to produce an error corrected combination as said checked data set and to judge that the semiconductor memory device is normal when the errors in the error corrected combination do not exist.

14. A semiconductor memory device as claimed in claim 13, wherein said error correction code decoder further corrects a readout data set read out of the data cell array as each data set with reference to the normal error correction code read out of the error correction code cell array in the normal mode.

15. A semiconductor memory device as claimed in claim 13, wherein said error correction code decoder comprises:

a syndrome generator supplied with a readout data set as each data set read out of the data cell array, a particular data set as either one of the normal error correction code and the test data set read out of the error correction code cell array in the normal mode and in the test mode, respectively, and the test error correction code from the code generating means, for generating a syndrome data set;

syndrome decoding means coupled with the syndrome generator, for decoding the syndrome data set to produce a decoded syndrome data set; and error correcting means supplied with the readout data set, the particular data set and the decoded syndrome data set, for correcting error occurring in the readout combination with reference to the decoded syndrome data set in the test mode to produce the error corrected combination.

16. A semiconductor memory device as claimed in claim 15, wherein said syndrome decoding means comprises:

a first syndrome decoder responsive to said syndrome data set, for decoding the syndrome data set into a first decoded syndrome data set intended for the data cell array; and a second syndrome decoder responsive to said syndrome data set, for decoding the syndrome data set into a second decoded syndrome data set which is intended for the error correction code cell array and forms the decoded syndrome data set together with the first decoded syndrome data set.

17. A semiconductor memory device as claimed in claim 16, wherein said error correcting means comprises:

a first error correcting unit coupled with the data cell array and the first syndrome decoder, for correcting at least one error occurring in the readout data set with reference to the first decoded syndrome data set to produce a first error corrected data set; and a second error correcting unit coupled with the error correction code cell array and the second syndrome decoder, for correcting at least one error occurring in the particular data set as the test data set with reference to the second decoded syndrome data set in the test mode to produce a second error corrected data set which forms the error corrected combination together with the first error corrected data set.

* * * * *